United States Patent
Schmidt et al.

(10) Patent No.: US 9,963,781 B2
(45) Date of Patent: May 8, 2018

(54) CARBON NANOTUBES GROWN ON NANOSTRUCTURED FLAKE SUBSTRATES AND METHODS FOR PRODUCTION THEREOF

(75) Inventors: Howard K. Schmidt, Cypress, TX (US); Robert H. Hauge, Houston, TX (US); Cary L. Pint, Houston, TX (US); Sean T. Pheasant, Houston, TX (US); Kent E. Coulter, Fair Oaks Ranch, TX (US)

(73) Assignees: SOUTHWEST RESEARCH INSTITUTE, San Antonio, TX (US); WILLIAM MARSH RICE UNIVERSITY, Houston, TX (US)

( * ) Notice: Subject to any disclaimer, the term of this patent is extended or adjusted under 35 U.S.C. 154(b) by 587 days.

(21) Appl. No.: 12/260,561

(22) Filed: Oct. 29, 2008

(65) Prior Publication Data

US 2010/0028613 A1 Feb. 4, 2010

Related U.S. Application Data

(60) Provisional application No. 60/983,487, filed on Oct. 29, 2007.

(51) Int. Cl.
| | |
|---|---|
| *C23C 16/26* | (2006.01) |
| *B82Y 30/00* | (2011.01) |
| *B82Y 40/00* | (2011.01) |
| *C23C 16/44* | (2006.01) |
| *C01B 32/162* | (2017.01) |

(52) U.S. Cl.
CPC .............. *C23C 16/26* (2013.01); *B82Y 30/00* (2013.01); *B82Y 40/00* (2013.01); *C01B 32/162* (2017.08);

(Continued)

(58) Field of Classification Search
None
See application file for complete search history.

(56) References Cited

U.S. PATENT DOCUMENTS

| | | | |
|---|---|---|---|
| 4,321,087 A | 3/1982 | Levine et al. | |
| 5,656,355 A * | 8/1997 | Cohen | 428/138 |
| 6,572,784 B1 * | 6/2003 | Coombs et al. | 252/301.16 |
| 6,692,717 B1 * | 2/2004 | Smalley et al. | 423/445 B |

(Continued)

FOREIGN PATENT DOCUMENTS

WO 1998/39250 A1 9/1998

OTHER PUBLICATIONS

Xu (Applied Physics Letters 89, 123116 (2006)).*

(Continued)

*Primary Examiner* — Joel G Horning
(74) *Attorney, Agent, or Firm* — Grossman Tucker et al.

(57) ABSTRACT

Carbon nanotubes grown on nanostructured flake substrates are disclosed. The nanostructured flake substrates include a catalyst support layer and at least one catalyst layer. Carbon nanotubes grown on the nanostructured flake substrates can have very high aspect ratios. Further, the carbon nanotubes can be aligned on the nanostructured flake substrates. Through routine optimization, the nanostructured flake substrates may be used to produce single-wall, double-wall, or multi-wall carbon nanotubes of various lengths and diameters. The nanostructured flake substrates produce very high yields of carbon nanotubes per unit weight of substrate. Methods for making the nanostructured flake substrates and for using the nanostructured flake substrates in carbon nanotube synthesis are disclosed.

10 Claims, 18 Drawing Sheets

(52) U.S. Cl.
CPC ...... *C23C 16/4417* (2013.01); *C01B 2202/02* (2013.01); *C01B 2202/04* (2013.01); *C01B 2202/08* (2013.01); *C01B 2202/34* (2013.01); *C01B 2202/36* (2013.01); *Y10T 428/24612* (2015.01)

(56) References Cited

U.S. PATENT DOCUMENTS

| | | | |
|---|---|---|---|
| 6,764,874 | B1 | 7/2004 | Zhang et al. |
| 7,071,406 | B2 | 7/2006 | Smalley et al. |
| 7,125,502 | B2 | 10/2006 | Smalley et al. |
| 7,968,488 | B2 | 6/2011 | Arps et al. |
| 2004/0045876 | A1* | 3/2004 | Glad ............... B01D 29/15 209/23 |
| 2004/0146642 | A1* | 7/2004 | Josephy et al. ............ 427/248.1 |
| 2005/0002851 | A1* | 1/2005 | McElrath et al. ......... 423/447.3 |
| 2005/0042162 | A1* | 2/2005 | Resasco et al. ........... 423/447.3 |
| 2005/0133045 | A1* | 6/2005 | Giannotti ..................... 128/897 |
| 2006/0062902 | A1* | 3/2006 | Sager ................... B22F 1/0018 427/74 |

OTHER PUBLICATIONS

Louis (Catalysis Today 102-103 (2005) 23-28).*

Murakami, et al., "Growth of vertically aligned single-wall carbon nanotube films on quartz substrates and their optical anisotropy", Chem. Phys. Lett., 385:2004, pp. 298-303.

Xu, et al., "Vertical Array Growth of Small Diameter Single-Walled Carbon Nanotubes", J. Am. Chem. Soc., 128:2006, pp. 6560-6561.

Li, et al., "Large-Scale Synthesis of Aligned Carbon Nanotubes", Science, 274:1996, pp. 1701-1703.

Pan, et al., "Very long carbon nanotubes", Nature, 394:1998, pp. 631-632.

Zhang, et al., "Rapid growth of well-aligned carbon nanotube arrays", Chem. Phys. Lett., 362:2002, pp. 285-290.

Christen, et al., "Rapid Growth of Long, Vertically Aligned Carbon Nanotubes through Efficient Catalyst Optimization Using Metal Film Gradients", Nano Lett., 4:2004, pp. 1939-1942.

Hata, et al., "Water-Assisted Highly Efficient Synthesis of Impurity-Free Single-Walled Carbon Nanotubes", Science, 306:2004, pp. 1362-1364.

Eres, et al., "Molecular Beam-Controlled Nucleation and Growth of Vertically Aligned Single-Wall Carbon Nanotube Arrays", J. Phys. Chem. B, 109:2005, pp. 16684-16694.

Liu, et al., "Single-walled carbon nanotubes produced by catalytic chemical vapor deposition of acetylene over Fe—Mo/MgO catalyst ", Chem. Phys. Lett., 383:2004, pp. 104-108.

Huang, "Growing carbon nanotubes on patterned submicron-size $SiO_2$ spheres", Carbon, 41:2003, pp. 2347-2352.

Agrawal, et al., "Hybrid Microstructures from Aligned Carbon Nanotubes and Silica Particles", Small, 1:2005, pp. 823-826.

Xiang, et al., "Large Area Growth of Aligned CNT Arrays on Spheres: Towards Large Scale and Continuous Production", Chem. Vap. Deposition Comm., 13:2007, pp. 533-536.

\* cited by examiner

CARBON NANOTUBES GROWN ON NANOSTRUCTURED FLAKE SUBSTRATES AND METHODS FOR PRODUCTION THEREOF

CROSS-REFERENCE TO RELATED APPLICATIONS

This application claims priority to U.S. provisional patent application 60/983,487, filed Oct. 29, 2007 which is incorporated by reference as if written herein in its entirety.

STATEMENT REGARDING FEDERALLY SPONSORED RESEARCH

This invention was made with government support under Grant No. NNJ06HI25A, awarded by the National Aeronautics and Space Administration. The government has certain rights in the invention.

BACKGROUND

Carbon nanotubes are a class of cylindrical all-carbon molecules consisting of a rolled-up graphene sheet or coaxial sheets of rolled-up graphene. Single-wall carbon nanotubes (SWNTs), which have been a focus of considerable research, may exist in metallic, semi-metallic or semiconducting forms. The specific electrical properties of these single-wall carbon nanotubes are governed at a minimum by their specific (n-m) chirality indices and nanotube diameter. In addition, all varieties of carbon nanotubes possess advantageous mechanical and thermal properties over conventional materials.

Processes for aligning SWNTs are advantageous for taking full advantage of their properties. Alignment enhances electrical, thermal, and mechanical properties of SWNT materials, conveying properties of the SWNTs to fibers and films where the SWNTs are aligned. High-density arrays of vertically aligned SWNTs have recently been prepared on an alumina substrate coated with a thin layer of Fe catalyst. Nanotube growth takes place at the Fe catalyst layer by chemical vapor deposition from a carbon feedstock gas. The aligned SWNTs are oriented perpendicular to the plane of the alumina substrate. In general, the resulting yield of aligned SWNTs is less than 1% per unit mass of substrate material. Even for bulk synthesis of non-aligned SWNTs, such as the HiPco process, the SWNT yield is only about 30% per unit mass of substrate material.

In view of the foregoing, methods providing a high percentage yield of carbon nanotubes per unit mass of substrate material would be of substantial utility. Ideally, the method may be altered to preferentially produce SWNTs or multi-wall carbon nanotubes as individual filaments, rather than bundles which are typically obtained from HiPco production. Further, methods and substrate materials that provide for facile alignment of arrayed SWNTs or arrayed multi-wall carbon nanotubes would be of considerable interest as well.

SUMMARY

In various embodiments, carbon nanotubes grown on nanostructured flake substrates are described. The nanostructured flake substrates comprise a support layer and at least one catalyst layer. The support layer has two sides. The at least one catalyst layer is deposited on at least one side of the support layer. The carbon nanotubes are grown from the at least one catalyst layer.

In other various embodiments, methods are presented for producing substantially aligned carbon nanotubes. The methods comprise coating a catalyst layer on a support layer, generating nanostructured flake substrates, and growing carbon nanotubes from the catalyst layer of the nanostructured flake substrates. The coating step comprises electron-beam deposition of the catalyst layer in a roll-to-roll thin film deposition system.

The foregoing has outlined rather broadly the features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing a specific embodiment of the disclosure, wherein.

DETAILED DESCRIPTION

Figure 1:
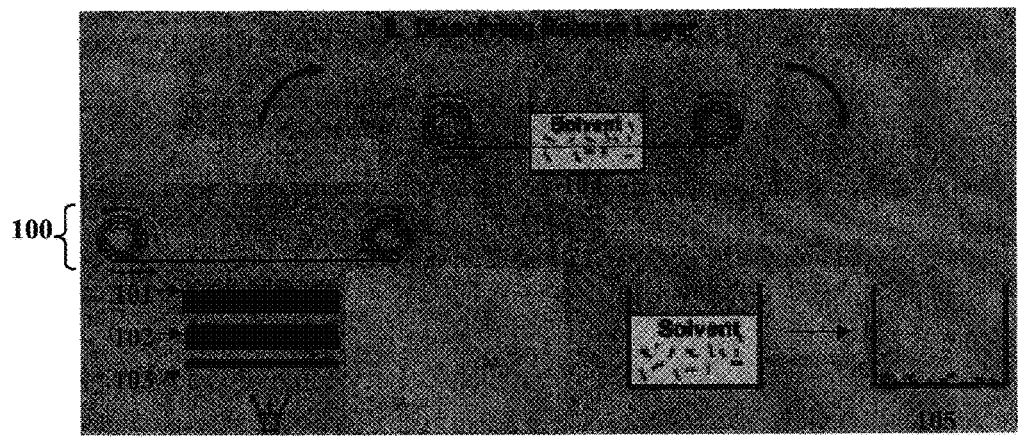
FIG. 1 shows an embodiment wherein nanostructured flake substrates are produced by a roll-to-roll evaporator system in the presence of an electron beam.

In the following description, certain details are set forth such as specific quantities, sizes, etc. so as to provide a thorough understanding of the present embodiments disclosed herein. However, it will be obvious to those skilled in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing a particular embodiment of the disclosure and are not intended to be limiting thereto. Drawings are not necessarily to scale.

While most of the terms used herein will be recognizable to those of skill in the art, the following definitions are nevertheless put forth to aid in the understanding of the present disclosure. It should be understood, however, that when not explicitly defined, terms should be interpreted as adopting a meaning presently accepted by those of skill in the art.

"Large-diameter SWNTs," as defined herein, refers to SWNTs having a diameter between about 1.5 nm and 6 nm.

"Small-diameter SWNTs," as defined herein, refers to SWNTs having a diameter less than about 1.5 nm.

"Substantially aligned," as defined herein, refers to a condition existing where greater than about 50 percent of a plurality of carbon nanotubes are parallel about their long axis.

"Very large diameter SWNTs," as defined herein, refers to SWNTs having a diameter greater than about 6 nm.

In various embodiments, the present disclosure describes carbon nanotubes grown on nanostructured flake substrates. The nanostructured flake substrates comprise a support layer and at least one catalyst layer. The support layer has two sides. The at least one catalyst layer is deposited on at least one side of the support layer. Carbon nanotubes are grown from the at least one catalyst layer. As described, the nanostructured flake substrates are nanostructured in one dimension (height) and microstructured in two dimensions (length and width). As such the layers are quasi-two-dimensional. Nanostructured or microstructured, as used herein, refers to a measure of length in a particular dimension. In certain embodiments, the carbon nanotubes are substantially aligned on the nanostructured flake substrates. In some of these various embodiments, the substantially aligned carbon nanotubes comprise predominantly SWNTs. In other of these various embodiments, the substantially aligned carbon nanotubes comprise multi-wall carbon nanotubes. In various embodiments, the substantially aligned carbon nanotubes occur as separated filaments, rather than ropes or bundles obtained through other carbon nanotube production methods. Carbon nanotubes grown on the nanostructured flake substrates have similar properties to those grown on macroscopic substrate materials, but have the advantage of not being bundled.

In the various embodiments of carbon nanotubes described herein, the carbon nanotubes are selected from a group consisting of single-wall carbon nanotubes, double-wall carbon nanotubes, multi-wall carbon nanotubes, small-diameter single-wall carbon nanotubes, large-diameter single-wall carbon nanotubes, and combinations thereof. It is to be understood in the discussion that follows that multi-wall carbon nanotubes refer to carbon nanotubes having more than one concentric tube. As such, double-wall carbon nanotubes as well as carbon nanotubes having more than two walls are encompassed by the term multi-wall carbon nanotubes. In certain embodiments, the carbon nanotubes are greater than about 50 µm in length. In other embodiments, the carbon nanotubes are greater than about 500 µm in length. In certain embodiments, the carbon nanotubes have aspect ratios greater than about 100:1 (length:width) In some embodiments, the carbon nanotubes comprise predominately single-wall carbon nanotubes. In other embodiments, the carbon nanotubes comprise predominately multi-wall carbon nanotubes. As used herein, predominantly refers carbon nanotube production that is about 95% exclusive for a given type of carbon nanotube.

Methods for preparing the nanostructured flake substrates are not particularly limited. In any of the various embodiments of nanostructured flake substrates disclosed hereinbelow, carbon nanotubes may be grown on the nanostructured flake substrates. Nanostructured flake substrates may be formed in an embodiment through roll-to-roll processing in an electron-beam evaporator system. This non-limiting process of forming the nanostructured flake substrates is illustrated schematically in FIG. 1. These substrates are produced in a roll-to-roll evaporator system 100, where three sequential evaporations are performed to deposit various layers on a 100 foot roll of mylar. The deposition rate of each layer is moderated by both the velocity of the take up reel and crucible heating rate with the electron beam. The first layer is a release layer 101 bound to the mylar. In some embodiments, the release layer is advantageously a water-soluble material, such as NaCl. Although the thickness of the release layer is not particularly important, in the embodiments described herein, a 400 nm thick layer of NaCl comprises the release layer.

The mylar roll is then wound through the evaporator system 100 a second time to deposit a support layer 102 on which at least one catalyst layer will eventually reside. Exemplary support layer material include, but are not limited to $Al_2O_3$, $SiO_2$, MgO, and TiN. In some embodiments of carbon nanotubes disclosed herein, the support layer comprises $Al_2O_3$. In other embodiments of carbon nanotubes disclosed herein, the support layer comprises MgO. Particular advantages of the various support layers are discussed in greater detail hereinbelow. In various embodiments, the support layer has a thickness between about 10 nm and about 80 nm. Support layer thicknesses in this range are advantageous for promoting growth of aligned SWNTs. In certain embodiments of carbon nanotubes disclosed herein, the support layer thickness is about 40 nm. In many embodiments, the support layer 102 comprises the bulk of the nanostructured flake substrate thickness. Accordingly, in some embodiments of carbon nanotubes disclosed herein, the nanostructured flake substrates themselves are between about 10 nm and about 80 nm in thickness. Although many of the particular embodiments described herein have utilized a support layer thickness of about 40 nm, this thickness should not be considered limiting in view of the wide range of support layer thicknesses that may be utilized. Varying the thickness of the support layer may be advantageous in certain embodiments, as can be established through routine optimization.

Finally, at least one catalyst layer 103 is deposited atop the support layer 102 by winding the mylar film through the evaporator system 100 a third time. In various embodiments, the catalyst composition, thickness, and density can be varied through a range of values. In certain embodiments of carbon nanotubes disclosed herein, the at least one catalyst layer comprises Fe. In certain embodiments of the carbon nanotubes where the at least one catalyst layer comprises Fe, the support layer 102 is selected from a group consisting of $Al_2O_3$ and MgO. In certain embodiments, the at least one catalyst layer 103 comprises a metal selected from a group including, but not limited to, Mo, Ni, Cr, Co, Pd, Cu and Au. In some embodiments of carbon nanotubes disclosed herein where the at least one catalyst layer 103 comprises Fe, the at least one catalyst layer 103 comprises at least one additional metal chosen from a group consisting of Mo, Ni, Cr, Co, Pd, Cu and Au. In certain embodiments, the at least one additional metal is alloyed with Fe. In certain other embodiments, the at least one additional metal forms a binary alloy with Fe. These alloying additions can beneficially enhance or regulate nanotube growth rates, reduce SWNT diameters, or even produce double- or multi-wall carbon nanotubes depending on the growth conditions.

The catalyst layer thickness can be varied through a wide range of values. A typical, but non-limiting thickness of the at least one catalyst layer 103 is about 0.5 nm. In various embodiments, the at least one catalyst layer 103 has a thickness between about 0.4 nm and about 1 nm. In other embodiments, the at least one catalyst layer 103 has a thickness between about 0.4 nm and about 2 nm. In still other various embodiments, the at least one catalyst layer 103 has a thickness between about 2 nm and about 10 nm. The thickness of the at least one layer 103 comprises one parameter that ultimately determines the diameter of the carbon nanotubes grown. The thickness of the at least one catalyst layer 103 also comprises one parameter that determines whether SWNTs or multi-wall carbon nanotubes are formed when using the nanostructured flake substrates. For example, thinner catalyst layers favor the production of primarily SWNTs. Catalyst layer thickness can be varied between about 0.4 nm and about 2 nm to achieve SWNT growth, all other parameters being fixed. As the catalyst layer becomes progressively thicker, the growth of multi-wall carbon nanotubes becomes increasingly favored.

Figure 2:
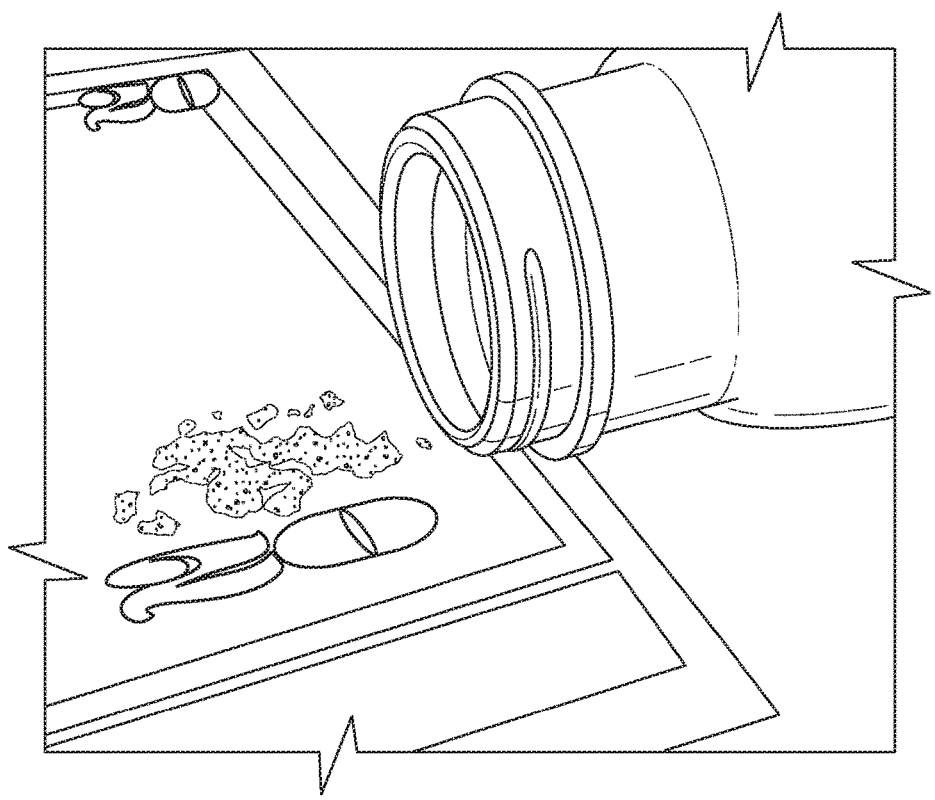
FIG. 2 shows an embodiment of nanostructured flake substrates following isolation.
Figure 3:
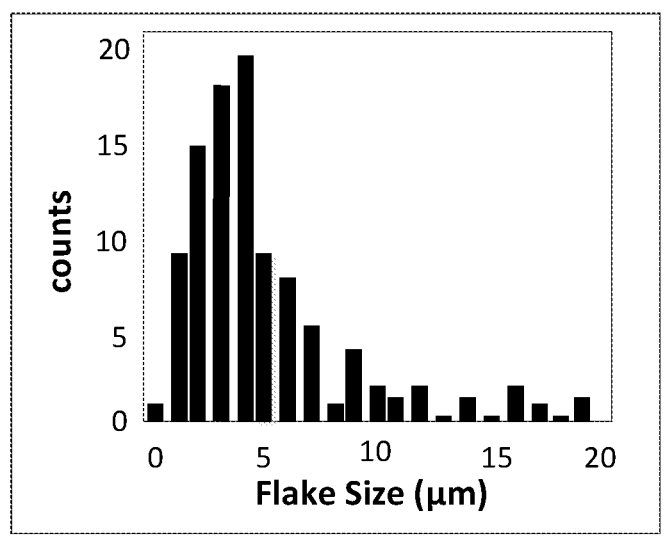
FIG. 3 shows an embodiment of a representative distribution of nanostructured flake substrate sizes, as shown in histogram format.
Figure 4:
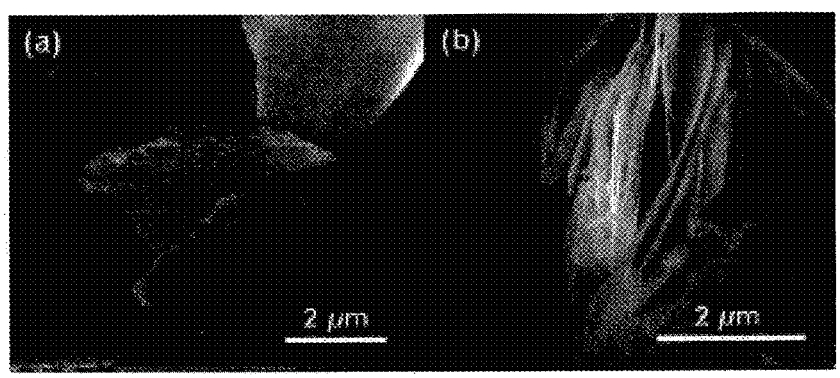
FIG. 4 shows embodiments of representative SEM images of the nanostructured flake substrates.

After the three-layer deposition process is complete, the coated mylar is rolled through a solvent bath 104. The solvent bath 104 comprises water in an embodiment. When the release layer 101 is water soluble, the release layer dissolves to detach the nanostructured flake substrates 105 from the mylar. The nanostructured flake substrates comprise support layer 102 and at least one catalyst layer 103. If the release layer 101 is not water-soluble, a solvent suitable for dissolving the release layer 101 can be chosen. The nanostructured flake substrates 105 are then collected and dried. FIG. 2 shows a photograph of the nanostructured flake substrates obtained following isolation. FIG. 3 shows a histogram of a representative distribution of flake sizes that are obtained. As such, the histogram exemplifies a representative embodiment of the sizes of carbon nanotube arrays that may be prepared using the nanostructured flake substrates. In certain embodiments of the carbon nanotubes described herein, the nanostructured flake substrates have a diameter between about 1 µm and about 20 µm. In certain other embodiments, the nanostructured flake substrates have a diameter between about 2 µm and about 8 µm. FIG. 4 shows representative SEM images of the nanostructured flake substrates.

Other methods may also be utilized for forming layered nanostructured materials for making nanostructured flake substrates. For example, sol-gel techniques may be used to grow an $Al_2O_3$ layer on a flexible substrate, such as latex. In various embodiments of the carbon nanotubes described herein, when the support layer is $Al_2O_3$, the $Al_2O_3$ is synthesized by sol-gel methods and deposited on a latex membrane. Use of a latex membrane is advantageous in forming the nanostructured flake substrates, since a release step in a solvent is not necessary. Several alternative routes can then be utilized to deposit the catalyst layer. Pre-made catalyst particles can be spun on to $Al_2O_3$-coated latex and dried. The coated latex can thereafter be flexed to release the nanostructured flake substrates. Alternatively, after coating on the latex, the $Al_2O_3$ can be functionalized with carboxylic groups and placed in a pre-made catalyst solution. This route will tend to bind the catalyst to the $Al_2O_3$, and then the latex can be flexed to release nanostructured flake substrates. Another contemplated route is to use atomic layer deposition (ALD) to deposit thin layers of $Al_2O_3$ on NaCl. In certain embodiments, the NaCl is functionalized with hydroxyl groups. After growing the $Al_2O_3$ layer, the NaCl and $Al_2O_3$ layers are placed in water, filtered, and dispersed in a pre-made catalyst solution. An advantage of this processing technique is that the catalyst coating takes place on two flat surfaces, which has the potential to double the carbon nanotube yield by allowing carbon nanotube arrays to grow on both sides of the support layer In certain embodiments, the support layer is also soluble in water or acid. An exemplary acid-soluble support layer is MgO. In various embodiments, the support layer comprises MgO. MgO support layers can be removed in a mild acid etch, such as dilute HCl. Similar conditions are used for removing the catalyst from the carbon nanotubes after growth. Carbon nanotubes grown on MgO supports can be liberated from the nanostructured flake substrates in a single processing step for removal of both catalyst and support layers. In contrast, $Al_2O_3$ is not soluble in water or acid, and separate steps are need to remove support layer and catalyst. In some embodiments, the support layer is electrically conductive. An exemplary conductive support layer is TiN. Carbon nanotube arrays grown on nanostructured flake substrates comprising TiN support layers could easily be integrated into electronics applications.

For processing the carbon nanotubes, the carbon nanotubes as grown on the nanostructed flake substrate are placed in an acid bath, such as HCl, to etch the catalyst particles from the ends of the carbon nanotubes. If the support layer is MgO, the MgO will also be etched by the acid, allowing processing of the carbon nanotubes in a single step. In the case where the support layer is $Al_2O_3$, an additional processing step is performed by drying the carbon nanotube material and thereafter soaking in a KOH bath to etch the $Al_2O_3$ layer.

The nanostructured flake substrates may be advantageously used for synthesizing carbon nanotubes by making the flake substrates airborne. This technical feature is accomplished in a specially-designed chemical vapor deposition (CVD) reactor for synthesis of carbon nanotubes. For the exemplary process that follows, the catalyst layer on the nanostructured flake substrates comprises Fe. In the CVD synthesis, a hot tungsten filament at a temperature greater than about 1600° C. generates atomic hydrogen when placed in a flow of $H_2$. The atomic hydrogen reduces the Fe catalyst into a metallic state. Metallic Fe precipitates carbon nanotubes in the presence of a carbonaceous growth gas. The conditions described in further detail hereinbelow produce predominantly SWNTs arrayed on the nanostructured flake substrates. Routine experimental optimization of various parameters is also discussed, which allows other types and diameters of carbon nanotubes to be favored by the deposition process.

Figure 5:
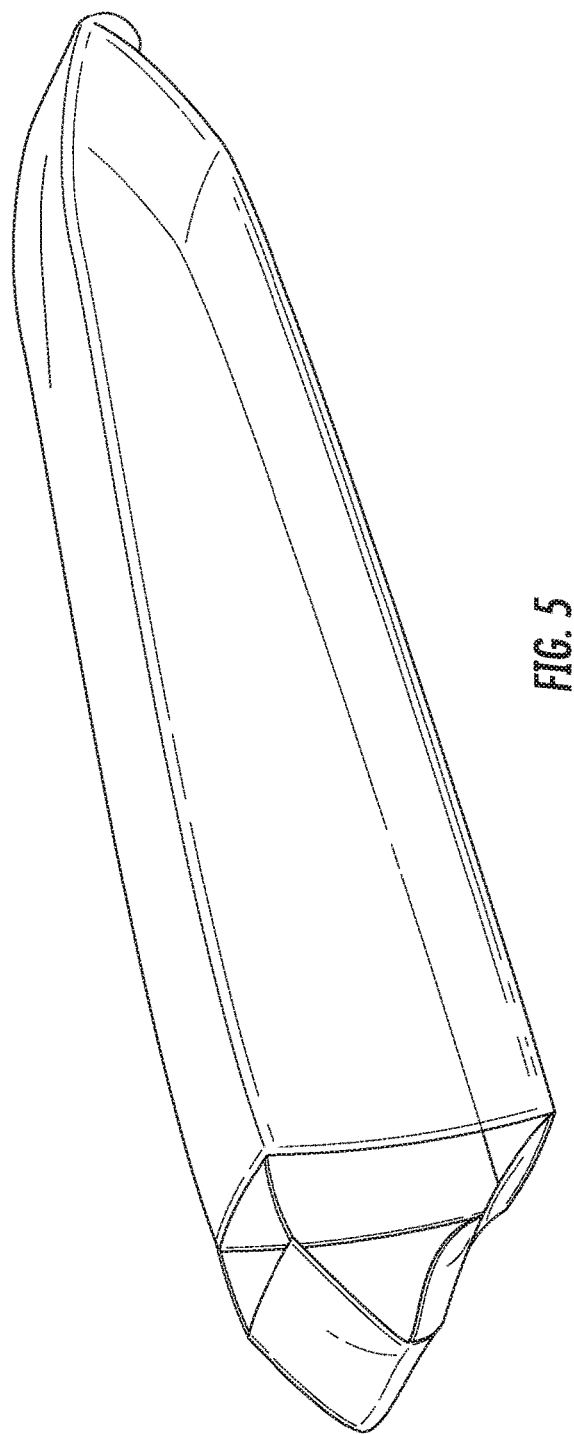
FIG. 5 shows an embodiment of a wire mesh enclosure used during CVD synthesis of carbon nanotubes with nanostructured flake substrates.

For the production of SWNTs arrayed on the nanostructured flake substrates, the gases used were $C_2H_2$, $H_2O_1$ and $H_2$, at flow rates of 2, 2, and 400 standard cubic centimeters per minute (sccm), respectively. In order to constrain the nanostructured flake substrates within the CVD reactor in the presence of the flowing gases, a cage was constructed by spot welding a stainless steel or copper mesh enclosure within the CVD reactor to form an enclosed area in which the flakes are placed prior to growth. An exemplary copper mesh enclosure is shown in FIG. 5. The mesh enclosure allows carbonaceous growth gases and atomic hydrogen to reach the nanostructured flake substrates, but the mesh size is not large enough to allow the airborne flake substrates to escape from the enclosure. Rapid nucleation of SWNTs occurs on the nanostructured flake substrates within the cage. Carbon nanotube growth is typically carried out for less than about 90 minutes, although the airborne nanostructured flake substrates retain catalytic activity for even longer times (past 6 hours). Accordingly, the highest yields of carbon nanotubes per unit mass of nanostructured flake substrate are achieved at longer growth times. Under the above growth conditions, SWNT production rates have been observed to be between about 3 μm to about 20 μm per minute, depending on the total gas pressure maintained in the reaction zone. With pressures of about 1.4 torr, a growth rate of 3 μm per minute is achieved. If the reaction zone gas pressure is increased to about 25 torr, the growth rate becomes approximately 20 μm per minute. In various embodiments, with growth conditions of 1.4 to 15 torr and 150 minutes of growth time, SWNTs can be grown on the nanostructured flake substrates, wherein the SWNTs have a length between about 50 μm and about 400 μm. Variation of the growth time allows carbon nanotubes of different lengths and aspect ratios to be produced.

Figure 6:
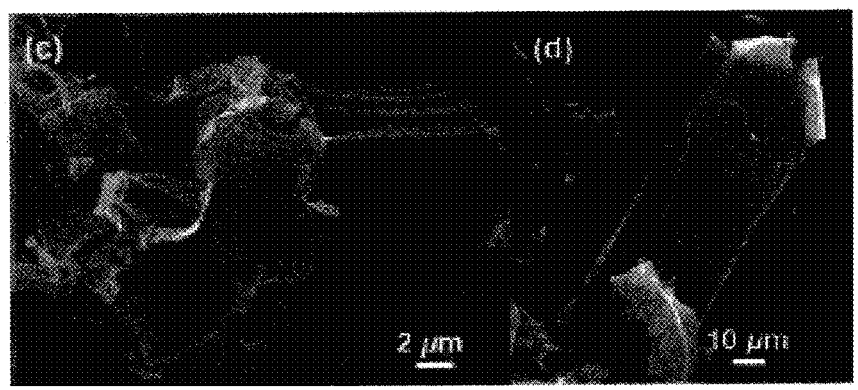
FIG. 6 shows embodiments of SEM images of low-aspect ratio SWNTs grown on nanostructured flake substrates.
Figure 7:
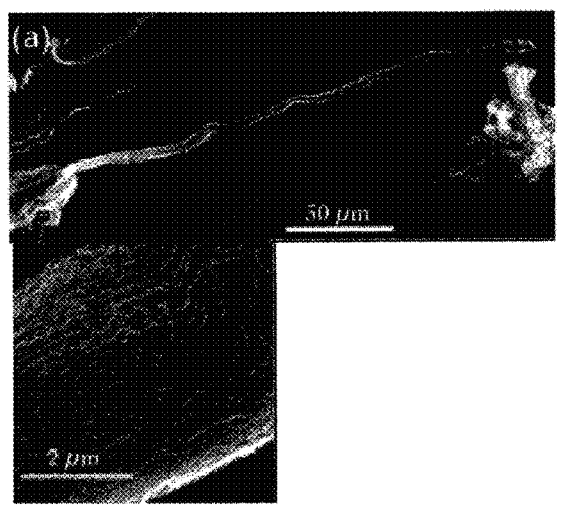
FIG. 7 shows an embodiment of an SEM image of high-aspect ratio SWNTs grown on nanostructured flake substrates
Figure 8:
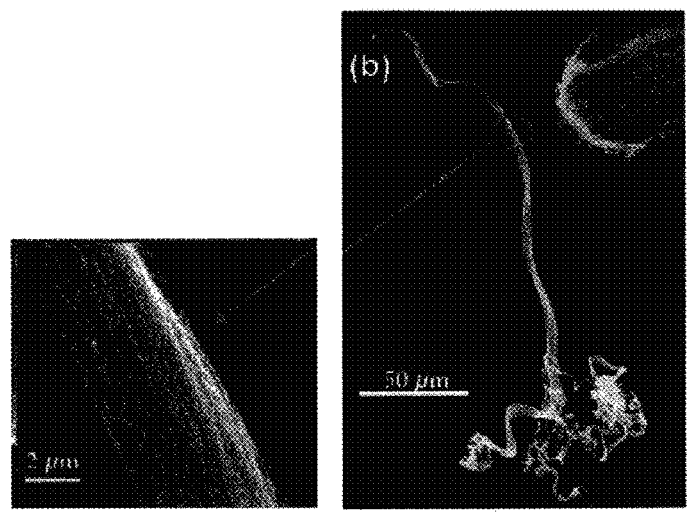
FIG. 8 shows another embodiment of an SEM image of high-aspect ratio SWNTs grown on nanostructured flake substrates.
Figure 9:
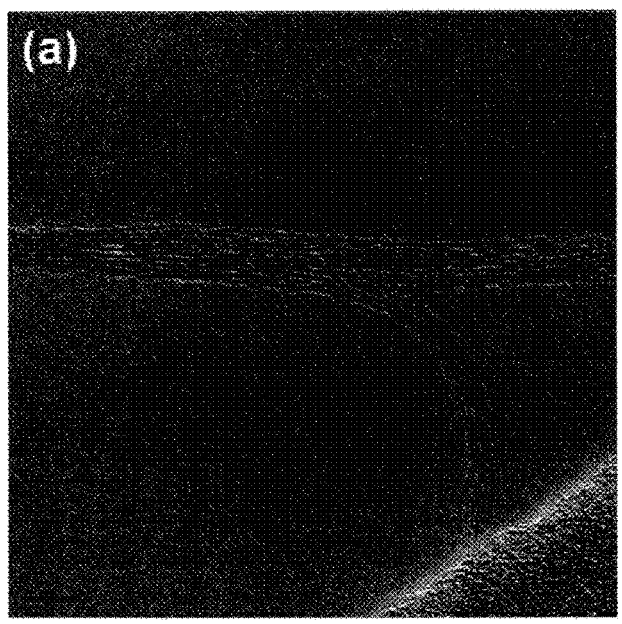
FIG. 9 shows an embodiment of a TEM image of high-aspect ratio SWNTs grown on nanostructured flake substrates.

FIG. 6 shows representative SEM images obtained for low-aspect ratio SWNTs as-grown on the nanostructured flake substrates. Growth of the SWNTs was performed at 1.4 torr. FIGS. 7 and 8 show representative SEM images obtained for various high-aspect ratio SWNTs grown on the nanostructured flake substrates. For the two SWNT arrays shown in FIGS. 7 and 8, the diameter of the arrays are between about 5 μm to about 7 μm, which corresponds well with the most abundant nanostructured flake substrate sizes shown in FIG. 3. The SWNTs shown in FIGS. 7 and 8 are in excess of 200 μm in length, yielding aspect ratios of greater than about 40:1. FIG. 9 shows a corresponding TEM image of the high-aspect ratio SWNTs. The TEM image shown in FIG. 9 emphasizes that the carbon nanotubes are composed predominantly of SWNTs.

Figure 10:
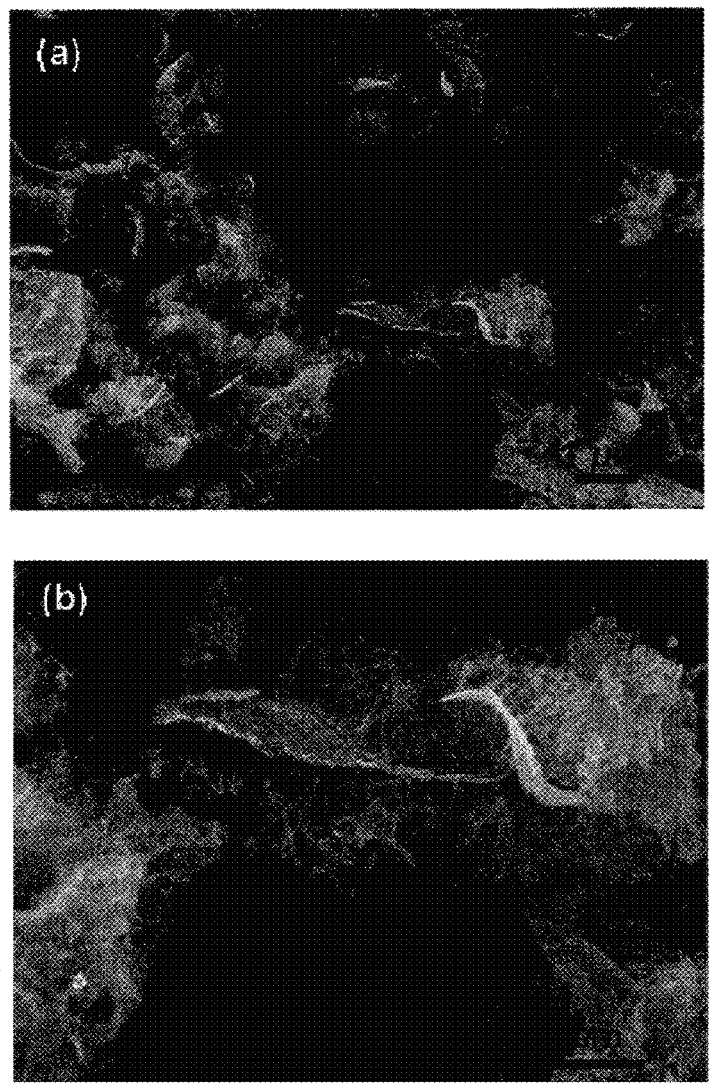
FIG. 10 shows an embodiment of an SEM image of multi-wall carbon nanotubes produced on nanostructured flake substrates.
Figure 11:
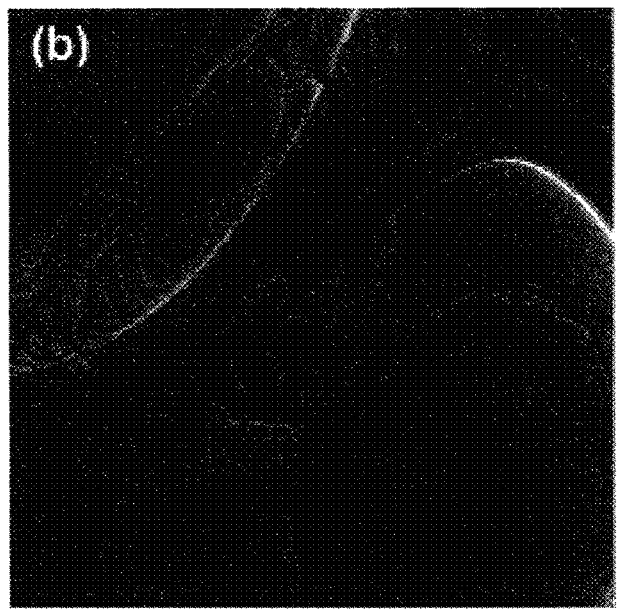
FIG. 11 shows an embodiment of a TEM image of multi-wall carbon nanotubes produced on nanostructured flake substrates.

As with the synthesis of carbon nanotubes on fixed substrate wafers, changes in growth conditions including, but not limited to, growth time, temperature, gas pressure or combinations thereof influence the quality and type of nanotubes grown. For example, the length of the carbon nanotubes grown can be altered by varying the growth time. This affects the aspect ratio obtained. Additionally, multi-wall carbon nanotubes may be preferentially grown on the nanostructured flake substrates under various conditions by alteration of these parameters. In some embodiments, these multi-wall nanotubes are mixed with SWNTs. In other embodiments, exclusively multi-wall nanotubes are produced on the nanostructured flake substrates. In particular, lower reaction temperatures and increased gas pressure (increased carbon flux) in the reaction zone lead to lower Raman G/D ratios, which provides evidence of increased multi-wall nanotube production and larger diameter SWNTs. Increasing the thickness of the catalyst layer also may produce multi-wall carbon nanotubes preferentially over SWNTs. As evidenced by the SEM image shown in FIG. 10, when the catalyst layer thickness was increased to about 5 nm, multi-wall carbon nanotubes were produced. Comparable conditions with a 0.5 nm thick catalyst layer produced predominantly SWNTs. The TEM image in FIG. 11 for a sample produced at 15 torr indicated a much greater percentage of larger diameter SWNTs than was produced at 1.4 torr, along with a higher fraction of multi-wall carbon nanotubes. Routine variation of catalyst layer thickness, reaction temperature, gas pressure, and reaction time to produce small-diameter SWNTs, large-diameter SWNTs, mixtures of multi-wall carbon nanotubes and SWNTs, and multi-wall carbon nanotubes alone reside within the spirit and scope of the present disclosure. In certain applications, production of mixtures of SWNTs and multi-wall carbon nanotubes may be advantageous, such as for field emission displays.

The nanostructured flake substrates are advantageous in that there is no constraint on the growth of the carbon nanotubes as is dictated by a fixed substrate. Rather, the carbon nanotubes are free to grow in such a way as to minimize the stresses associated with carbon nanotube growth from the nanostructured flake substrate surface. This feature of the disclosure is particularly shown in the twisting and curling of the carbon nanotubes shown in FIGS. 7 and 8. For example, arrays with aspect ratios greater than or about equal to those shown in FIGS. 7 and 8 (about 40:1) tended to coil inwardly upon themselves. When such coiling occurs, measurement of the length of the carbon nanotubes becomes difficult.

For a 90 minute growth time at 25 torr, a yield of carbon nanotubes per unit mass of nanostructured flake substrate was greater than about 400%. For example, starting with only 3.4 mg of the nanostructured flake substrate, 18.6 mg of carbon nanotubes plus nanostructured flake material were collected. A similar yield was obtained at 12 torr over 300 minutes of growth. As the catalyst flakes have viable lifetimes of at least six hours, an estimated yield of carbon nanotubes per unit mass of catalyst could be greater than 1800% upon optimization of the growth conditions. Additionally, one must also consider whether yield or nanotube quality is the primary consideration in optimizing the growth conditions. The utility of the nanostructured flake substrates are clearly evident when one considers that typical fixed substrates only provide a yield of about 30% per unit mass of catalyst. Further, these yields for fixed substrates produce carbon nanotube bundles. When one considers aligned carbon nanotube arrays, the yields on fixed substrates plummets to about 1%.

Figure 12:
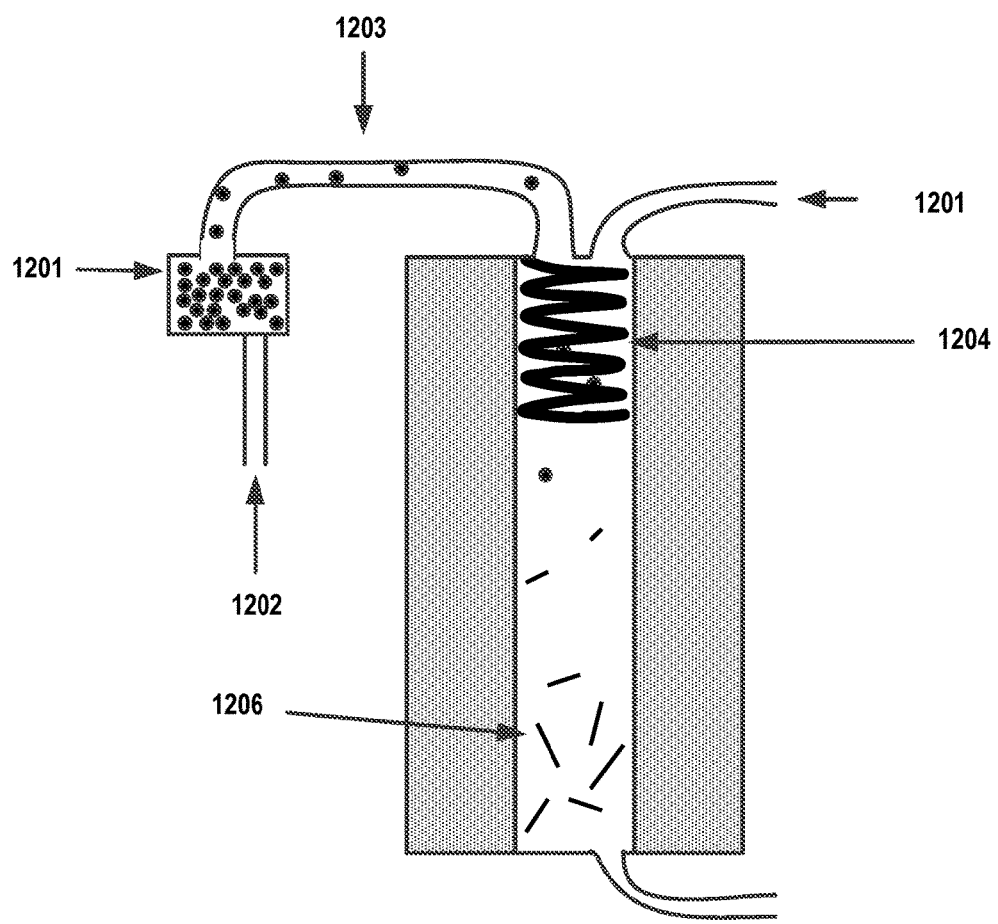
FIG. 12 shows an embodiment of a modified CVD reactor system utilizing a piezoelectric cavity for housing nanostructured flake substrates.

A modified CVD reactor designed to take advantage of the nanostructured flake substrates is illustrated in FIG. 12. This reactor setup is advantageous over utilizing the mesh screen enclosure described hereinabove. In this reactor, the nanostructured flake material is held in a cavity 1201 that is subjected to vibrations from a piezoelectric oscillator. The nanostructured flake substrates become airborne in the presence of Ar flow 1202 and move through a feed-line 1203 to the reactor, where they diffuse through a coiled tungsten filament 1204. $C_2H_2$ and hydrogen gas are supplied through feed-line 1205. Atomic hydrogen generated at the filament 1204 reduces the catalyst for carbon nanotube growth. As the nanostructured flake substrates nucleate carbon nanotubes, the materials move into collection area 1206 where free diffusion of the nanostructured flake substrates continues. Carbon nanotube growth continues in the collection area 1206. Diffusion of the nanostructured flake substrates out of the collection area 1206 is inhibited by layers of copper mesh placed between the vacuum pump and the collection area. Since the ends of the growing carbon nanotubes are free to move in the reaction volume, especially long carbon nanotubes can be grown. This reactor design overcomes a number of mechanical stresses that result in discontinued nanotube growth. The design of this reactor system should not be considered limiting.

Use of the nanostructured flake substrates for growing carbon nanotubes is especially advantageous for preparation of individual (non-entangled) carbon nanotubes and aligned carbon nanotube arrays. Growth of carbon nanotubes from a spherical catalyst particles on fixed, bulk substrates leads to a high nucleation density of carbon nanotubes. However, as growth proceeds, the carbon nanotubes eventually become entangled to produce ropes or bundles. The thin nanostructured flake substrates disclosed herein advantageously overcome the entanglement problem, while providing a growth surface analogous to that of a macroscopically flat fixed substrate. As such, the nanostructured flake substrates can advantageously produce ultra-long, individual carbon nanotubes. Carbon nanotubes with aspect ratios (length/width) of greater than about 100:1 may be produced under conditions described hereinabove.

In other various embodiments, methods for producing substantially aligned carbon nanotubes are disclosed. The methods comprise coating a catalyst layer on a support layer; generating nanostructured flake substrates; and growing carbon nanotubes from the catalyst layer of the nanostructured flake substrates. The coating step comprises electron-beam deposition of the catalyst layer in a high-vacuum roll-to-roll thin film deposition system. In some embodiments, generating the nanostructured flake substrates is accomplished by flexing the support and catalyst layers. In some embodiments of the methods, the nanostructured flake substrates are suspended during the growing step. Suspended refers to free motion throughout the reaction volume, without the nanostructured flake substrates residing on a particular surface. Free motion may be accomplished by making the nanostructured flake substrates airborne. In some embodiments of the methods, the methods further comprise removing the substantially aligned carbon nanotubes from the nanostructured flake substrates.

In some embodiments of the methods, the substantially aligned carbon nanotubes produced by the method are selected from a group consisting of single-wall carbon nanotubes, double-wall carbon nanotubes, multi-wall carbon nanotubes, small-diameter single-wall carbon nanotubes, large-diameter single-wall carbon nanotubes, and combinations thereof. In certain embodiments of the methods, the substantially aligned carbon nanotubes comprise predominantly single-wall carbon nanotubes. In certain embodiments of the methods, the substantially aligned carbon nanotubes comprise predominately multi-wall carbon nanotubes. As discussed hereinabove, double-wall carbon nanotubes are encompassed within the term multi-wall carbon nanotubes. In certain embodiments of the methods, the catalyst layer has a thickness between about 0.4 nm and about 2 nm. Such catalyst layer thicknesses produce SWNTs in certain embodiments of the methods.

In certain embodiments of the methods, the nanostructured flake substrates have a diameter between about 1 μm and about 20 μm. In certain embodiments of the methods, the nanostructured flake substrates have a thickness between about 10 nm and about 80 nm. In various embodiments of the methods, the support layer is selected from a group consisting of $Al_2O_3$, $SiO_2$, MgO, and TiN. Particular advantages and features of these support layers have been discussed in more detail hereinabove. In various embodiments of the methods, the catalyst layer comprises Fe. At least one other metal can be present in addition to Fe. In certain embodiments of the methods, the catalyst layer further comprises at least one additional metal chosen from the group consisting of Mo, Ni, Cr, Co, Pd, Cu, and Au. In certain other embodiments of the methods, the catalyst layer comprises at least one metal selected from the group consisting of Mo, Ni, Cr, Co, Pd, Cu, Au and combinations thereof.

The growth rate and length of carbon nanotubes may be controlled by the methods. In some embodiments of the methods, a growth rate of substantially aligned carbon nanotubes is between about 3 μm per minute and about 20 μm per minute. In other various embodiments of the methods, a length of the substantially aligned carbon nanotubes is controlled by a duration of reaction time.

EXPERIMENTAL EXAMPLES

The following experimental examples are included to demonstrate particular aspects of the present disclosure. It should be appreciated by those of skill in the art that the methods described in the examples that follow merely represent exemplary embodiments of the disclosure. Those of skill in the art should, in light of the present disclosure, appreciate that many changes can be made in the specific embodiments described and still obtain a like or similar result without departing from the spirit and scope of the present disclosure.

Example 1: Carbon Nanotubes Grown at 1.4 Torr

Raman Spectroscopy Characterization

Figure 13:
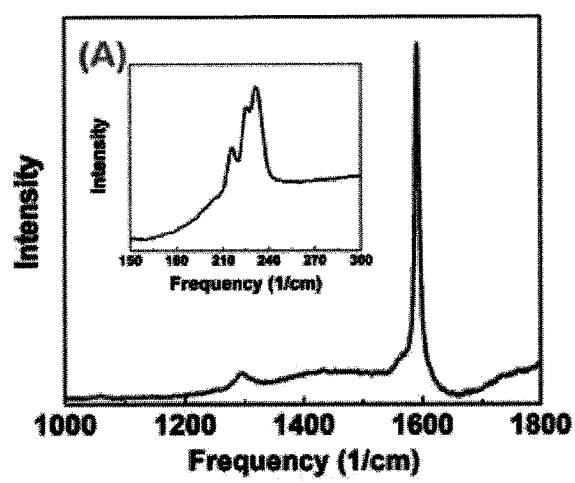
FIG. 13 shows an embodiment of a Raman spectrum of SWNTs grown on nanostructured flake substrates, following surfactant suspension and 785 nm excitation.
Figure 14:
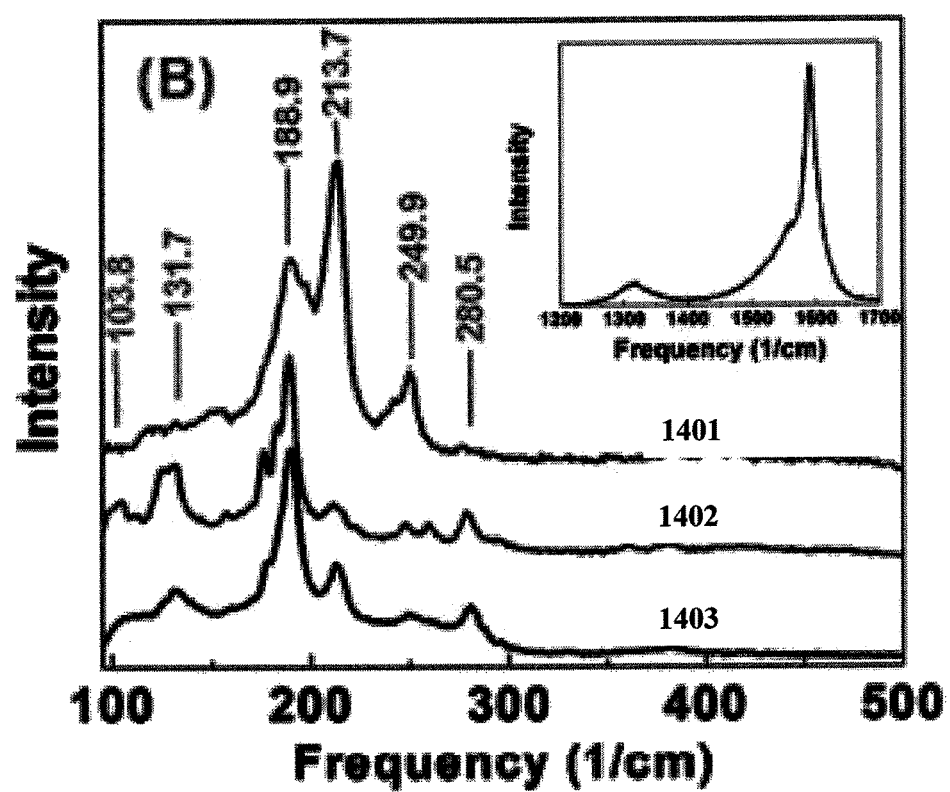
FIG. 14 shows an embodiment of the radial breathing modes of as-grown SWNTs grown on nanostructured flake substrates.

Carbon nanotube samples for this example were grown at 1.4 torr. Predominantly SWNTs were produced. Raman spectroscopy provides a semi-quantitative measure of SWNT diameters. Excitation wavelengths of 633 nm and 785 nm were used for both the raw material as-grown and for surfactant-suspended SWNTs. For surfactant suspension, the SWNTs were dispersed in 1 wt. % sodium deoxycholate by tip sonication, followed by centrifugation at 12000 RPM for 75 minutes. This treatment was sufficient to remove residual nanostructured flake substrates and other particulates from the solution containing the dispersed SWNTs. As shown in FIG. 13, the resulting G/D ratio was high for this dispersion after 785 nm excitation, yielding a G/D ratio of about 35 after baseline subtraction. It should be noted that there is a broad peak between the G (~1592 $cm^{-1}$) and D (~1350 $cm^{-1}$) peaks resulting from fluorescence emission of a small diameter semiconducting SWNT overlapping with the Raman spectrum. The inset of FIG. 13 shows the radial breathing modes (RBMs), indicating the presence of SWNTs. Comparative RBM spectra for aligned HiPco SWNTs spun as a fiber 1401, SWNTs grown on a fixed substrate 1402, and SWNTs grown on a nanostructured flake substrate 1403 are shown in FIG. 14. The Raman spectra in FIG. 14 were obtained for solid samples, not for surfactant suspensions. FIG. 14 demonstrates that the SWNTs grown on the nanostructured flake substrates were comparable in quality to those produced by other methods. The six RBMs present correspond to SWNTs having diameters ranging between about 0.6 nm and about 1.8 nm. The larger diameter SWNTs with an RBM at 103.7 $cm^{-1}$, were present in fairly low abundance in the SWNTs grown on the nanostructured flake substrates 1403, as compared to a higher abundance of this species in SWNTs grown on a fixed substrate 1402. The as-grown SWNT array on the nanostructured flake substrate showed a G/D ratio of about 10, following baseline subtraction. This value is indicative of high-quality SWNTs, with relatively few wall defects or amorphous carbon present, even in the as-produced material. The considerably higher G/D value obtained after surfactant suspension attests to the very high-quality carbon nanotubes that can be produced by the methods described herein.

Fluorescence Characterization

Figure 15:
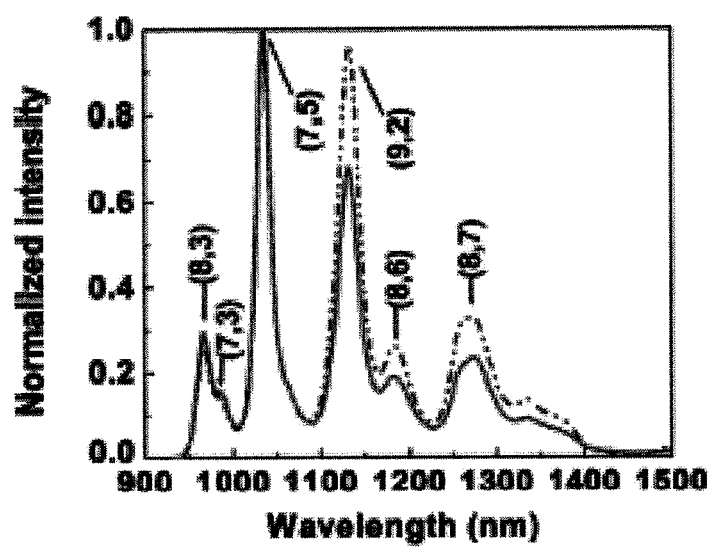
FIG. 15 shows an embodiment of a fluorescence spectrum of SWNTs grown on nanostructured flake substrates following 660 nm excitation.
Figure 16:
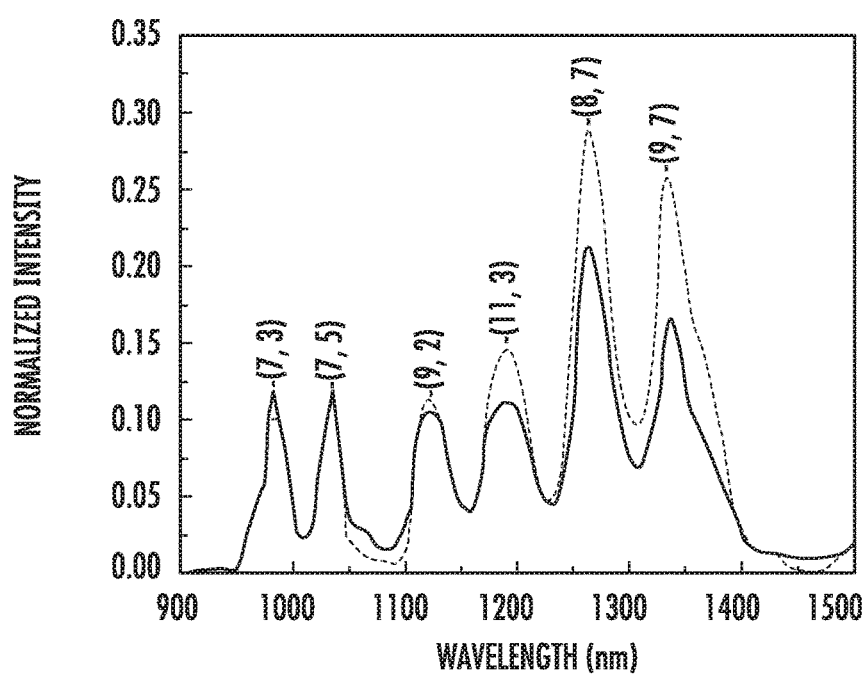
FIG. 16 shows an embodiment of a fluorescence spectrum of SWNTs grown on nanostructured flake substrates following 780 nm excitation.

Fluorescence is an excellent tool for detecting the presence of small diameter, semiconducting SWNTs, since only semiconducting SWNTs are known to fluoresce. Fluorescence measurements were conducted on surfactant suspended SWNTs with 660 nm and 780 nm excitations. The fluorescence spectrum for each excitation wavelength is shown respectively in FIGS. 15 and 16. In both FIGS. 15 and 16, properties of SWNTs grown on the nanostructured flake substrates were similar to those of SWNTs grown on macroscopic fixed substrates. In other words, the distribution of semiconducting SWNTs obtained was similar by the two methods. The nanostructured substrates produce a slight trend toward smaller diameter semiconducting SWNTs. The (n,m) assignment for each SWNT peak is labeled in FIGS. 15 and 16. These results further emphasize the high-quality of SWNTs produced using the nanostructured flake substrates.

Example 2: Carbon Nanotubes Grown at 15 Torr

Raman Spectroscopy Characterization

Figure 17:
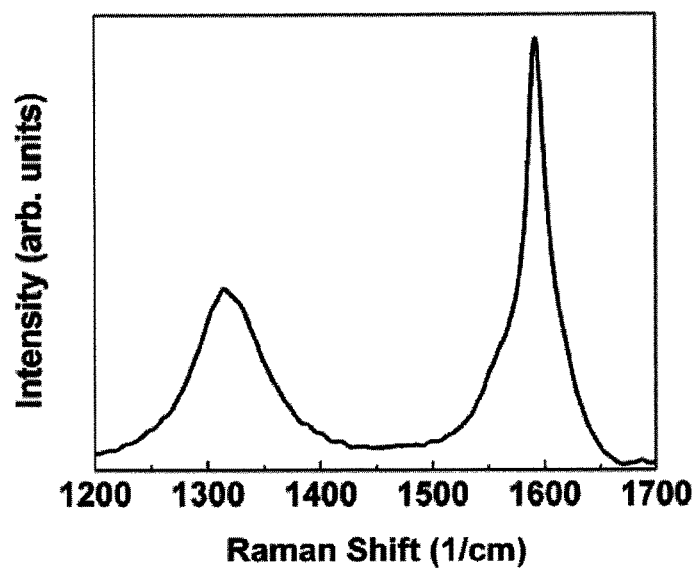
FIG. 17 shows an embodiment of a Raman spectrum of multi-wall carbon nanotubes grown on nanostructured flake substrates, following 633 nm excitation.

Carbon nanotubes for this example were grown at 15 torr. An increased production of multi-wall carbon nanotubes occurred at the higher pressure. A high D band intensity was observed in the Raman spectrum following 633 nm excitation as is shown in FIG. 17. The increased D band intensity is indicative of the presence of multi-wall carbon nanotubes. For example, the G/D ratio in FIG. 17 is only about 2.7, as compared to a G/D ratio of about 10 for as-produced carbon nanotubes prepared comparably at 1.4 torr.

Fluorescence Characterization

Figure 18:
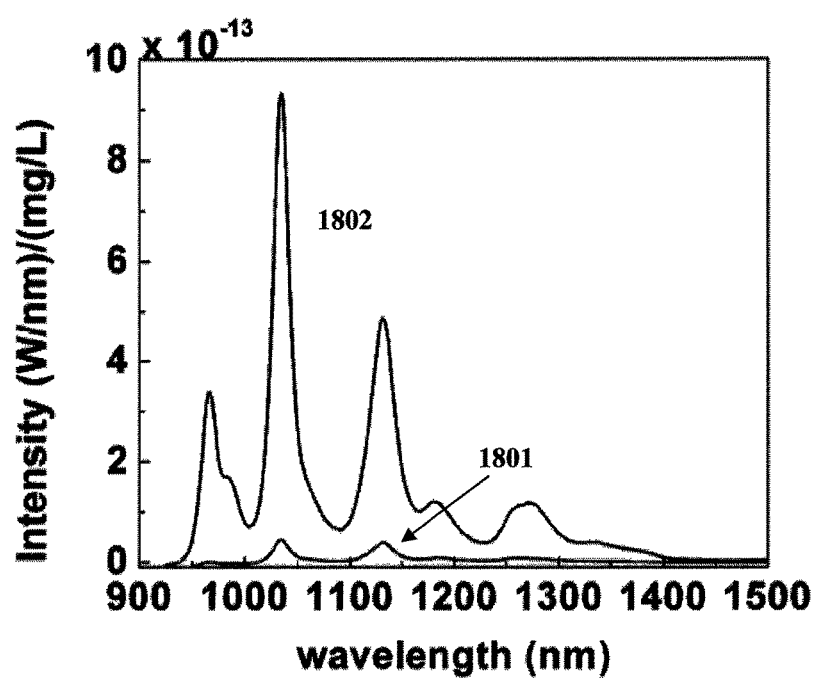
FIG. 18 shows an embodiment of a fluorescence spectrum of multi-wall carbon nanotubes grown on a nanostructured flake substrate in comparison to SWNTs run under the same conditions.

Fluorescence measurements are also supportive of the increased production of multi-wall carbon nanotubes at higher pressures. As shown in FIG. 18, the fluorescence intensity for carbon nanotubes produced at 15 torr (1801) decreased by nearly an order of magnitude relative to carbon nanotubes produced at 1.4 torr (1802). This decrease is consistent with a lower production incidence of SWNTs (specifically semiconducting SWNTs) in the carbon nanotubes produced at 15 torr.

From the foregoing description, one skilled in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims

What is claimed is:

1. A method for producing substantially aligned, separated carbon nanotubes, wherein the method comprises:
    coating a catalyst layer having a thickness of about 0.4 to 2 nm on a support layer comprising $Al_2O_3$ on a flexible substrate, said support layer having a thickness of 10 nm to 80 nm;
    wherein the coating step comprises electron-beam deposition of the catalyst layer in a high-vacuum roll-to-roll thin film deposition system;
    flexing said flexible substrate to release said support layer from said flexible substrate without the use of a solvent so as to form nanostructured, catalyst-coated, flake substrates having diameters of about 2 to 8 μm;
    vibrating said nanostructured, catalyst-coated, flake substrates with a piezoelectric oscillator causing the nanostructured, catalyst-coated, flake substrates to become airborne in argon and move through a feed-line to a reactor;
    diffusing said nanostructure, catalyst-coated, flake substrates through a coiled tungsten filament in said reactor;
    floating said nanostructured, catalyst-coated, flake substrates in a flow of gas of atomic hydrogen and a carbonaceous gas;
    growing predominantly separated filaments of substantially aligned single wall carbon nanotubes of greater than 50 μm to 400 μm in length at pressures of 1.4 torr to 15 torr on said nanostructured, catalyst-coated, flake substrates as said nanostructured, catalyst-coated, flake substrates are diffused in a collection area and said nanostructured, catalyst-coated, flake substrates are retained in said collection area by mesh, wherein the growing proceeds at a rate of between about 3 μm per minute and about 20 μm per minute; and
    separating the single wall carbon nanotubes from the nanostructured, catalyst-coated, flake substrates by etching the support layer in a KOH bath and etching the catalyst layer from the single wall carbon nanotubes in an acid bath.

2. The method of claim 1, wherein the catalyst layer comprises Fe.

3. The method of claim 2, wherein the catalyst layer further comprises at least one additional metal chosen from the group consisting of Mo, Ni, Cr, Co, Pd, Cu and Au.

4. The method of claim 2, wherein the catalyst is reduced to metallic Fe upon exposure to atomic hydrogen.

5. The method of claim 1, wherein a length of the substantially aligned carbon nanotubes is controlled by a duration of reaction time.

6. The method of claim 1, wherein the pressure is 1.4 torr.

7. The method of claim 1, wherein the carbonaceous gas is acetylene.

8. The method of claim 1, wherein the floating is performed in a mixture of $C_2H_2:H_2O:H_2$ at a respective flow rates of 2:2:400 $cm^3$/min.

9. The method of claim 1, wherein the catalyst layer has a thickness of 0.5 nm.

10. The method of claim 1, further separating the single wall carbon nanotubes from the nanostructured, catalyst-coated, flake substrates by sonication.

* * * * *